(12) United States Patent
van de Haar et al.

(10) Patent No.: US 10,613,918 B2
(45) Date of Patent: Apr. 7, 2020

(54) DATA REGISTER MONITORING

(71) Applicant: NXP B.V., Eindhoven (NL)

(72) Inventors: Peter van de Haar, Veldhoven (NL); Lucas Pieter Lodewijk van Dijk, Kranenburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/895,171

(22) Filed: Feb. 13, 2018

(65) Prior Publication Data

US 2019/0250974 A1 Aug. 15, 2019

(51) Int. Cl.
*G06F 7/02* (2006.01)
*H03M 13/00* (2006.01)
*G06F 11/07* (2006.01)
*G11C 29/04* (2006.01)
*G11C 29/42* (2006.01)
*G11C 29/44* (2006.01)
*G11C 29/52* (2006.01)
(Continued)

(52) U.S. Cl.
CPC .......... *G06F 11/0751* (2013.01); *G06F 11/07* (2013.01); *G06F 11/073* (2013.01); *G06F 11/0745* (2013.01); *G06F 11/0772* (2013.01); *G06F 13/1668* (2013.01); *G11C 29/04* (2013.01); *G11C 29/42* (2013.01); *G11C 29/44* (2013.01); *G11C 29/52* (2013.01); *G11C 2029/0409* (2013.01); *H03K 19/21* (2013.01)

(58) Field of Classification Search
CPC ............... G06F 11/073; G06F 11/0745; G06F 11/0772; G06F 13/1668; G06F 11/267; G11C 29/12; G11C 7/1036; G11C 29/32; G11C 7/1078; G11C 29/12015; G01R 31/3177; G01R 31/318558; G01R 31/318566; G01R 31/3187; G01R 31/31725; G01R 31/318572; G01R 31/318536; G01R 31/31727; G01R 31/318541; G01R 31/318508; G01R 31/318547; G01R 31/318516; G01R 31/31922; G01R 31/31921; G01R 31/3193; G01R 31/318594
See application file for complete search history.

(56) References Cited

U.S. PATENT DOCUMENTS 5,831,988 A 11/1998 Fagerness
6,968,478 B1 11/2005 Edwards et al.
8,612,814 B1 12/2013 Tan et al.
(Continued)

*Primary Examiner* — Guerrier Merant
(74) *Attorney, Agent, or Firm* — Rajeev Madnawat

(57) ABSTRACT

Aspects of the present disclosure are directed to assessing characteristics of stored data, as may be implemented for verification thereof. As may be implemented in connection with one or more apparatus or method-based embodiments, a first data signature is generated, which corresponds to a logical derivation of configuration data sent over a data bus. Outputs that correspond to data read out from each of a plurality of configuration registers, which receive the configuration data over the data bus, are logically combined into a second data signature. The first data signature and the second data signature are processed and compared for ascertaining that stored data, as stored in each of the plurality of configuration registers, accurately corresponds to the configuration data sent over the data bus for writing into each of the plurality of configuration registers.

18 Claims, 6 Drawing Sheets

(51) Int. Cl.
*G06F 13/16* (2006.01)
*H03K 19/21* (2006.01)

(56) References Cited

U.S. PATENT DOCUMENTS

| | | |
|---|---|---|
| 9,389,793 B2 | 7/2016 | Soja et al. |
| 9,672,095 B2 | 6/2017 | Robertson et al. |
| 9,984,257 B2 | 5/2018 | Van De Haar et al. |
| 2009/0316506 A1 | 12/2009 | Cooke |
| 2011/0179323 A1 | 7/2011 | Kuo et al. |
| 2015/0325314 A1* | 11/2015 | Ziaja .................. G11C 29/12 365/189.02 |
| 2015/0363355 A1 | 12/2015 | Concer et al. |
| 2018/0059183 A1* | 3/2018 | Maeda ........... G01R 31/318547 |

\* cited by examiner

DATA REGISTER MONITORING

OVERVIEW

Aspects of various embodiments are directed to monitoring, such as may involve error assessment, regarding one or more aspects of data storage.

In a variety of applications involving the communication of data, the data to be stored in registers or otherwise is susceptible to a variety of error conditions. For instance, data may be corrupted or include other errors, and data may be written to an incorrect address. While certain errors can be recovered, doing so can take time and require processor involvement. Where the accuracy of data and detecting inaccuracies is particularly important, such as in safety-type applications involving automotive components or other equipment, identifying such errors can be useful.

For instance, configuration registers can be written from a bus that is controlled by a microprocessor system. It can be important to ascertain that the data that is written in a register is indeed written to the intended register, and that the intended register content is indeed programmed in the register. One approach involves performing a read-back (e.g., by a microprocessor) of registers and assessing at the microprocessor (e.g., by comparing a signature to a known signature matching the state of the device). However, where many registers are involved, read-back over the entire register set poses a large load on the microprocessor, and read-back content verification may require recurring involvement of the microprocessor. For any registers that perform an action on read-back (e.g. perform a reset), the proper state of the device can be altered and, thus, such registers may not be capable of evaluation in a read-back mode. Further, a signature on read-back values may not provide an accurate assessment of whether stored data is correctly present on the output of the registers, and or whether the data was stored in the proper location. Read-back also requires a software-based initiator.

These and other matters have presented challenges to accuracies and efficiencies of data storage implementations, for a variety of applications.

SUMMARY

Various example embodiments are directed to issues such as those addressed above and/or others which may become apparent from the following disclosure concerning ensuring the accuracy of data, such as may pertain to ensuring that data is stored in a proper location and/or that the data is error-free. In certain contexts, these approaches are utilized for applications in which monitoring data is important, such as with automobile applications in which data is stored and utilized for braking, navigation, and other functions.

In certain example embodiments, aspects of the present disclosure involve assessing stored data based on data that is intended to be stored, such as by comparing the stored data with data collected from a bus via which the stored data is communicated. These aspects can be useful for ensuring that the data itself is accurate and/or that the data is stored in a proper location. Various embodiments involve assessing the data in this regard using a hardware-based approach, which can limit or eliminate any burden upon a microprocessor that directs the storage of the data.

As may be implemented in connection with one or more apparatus or method-based embodiments, a first data signature is generated, which corresponds to a logical derivation of configuration data sent over a data bus. Outputs that correspond to data read out from each of a plurality of configuration registers, which receive the configuration data over the data bus, are logically combined into a second data signature. The first data signature and the second data signature are processed and compared for ascertaining that stored data, as stored in each of the plurality of configuration registers, accurately corresponds to the configuration data sent over the data bus for writing into each of the plurality of configuration registers.

In a more specific embodiment, a circuit-based apparatus includes a data bus, a plurality of configuration registers configured and arranged to receive configuration data over the data bus, and logic circuitry configured and arranged to ascertain that stored data, as stored in each of the plurality of configuration registers, and accurately corresponds to the configuration data sent over the data bus for writing into each of the plurality of configuration registers. Specifically, the logic circuitry stores a first data signature corresponding to a logical derivation of the configuration data sent over the data bus, and further logically combines outputs into a second signature, where the outputs correspond to data read out from each of the configuration registers. The logic circuitry further processes and compares the first data signature and the second data signature.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
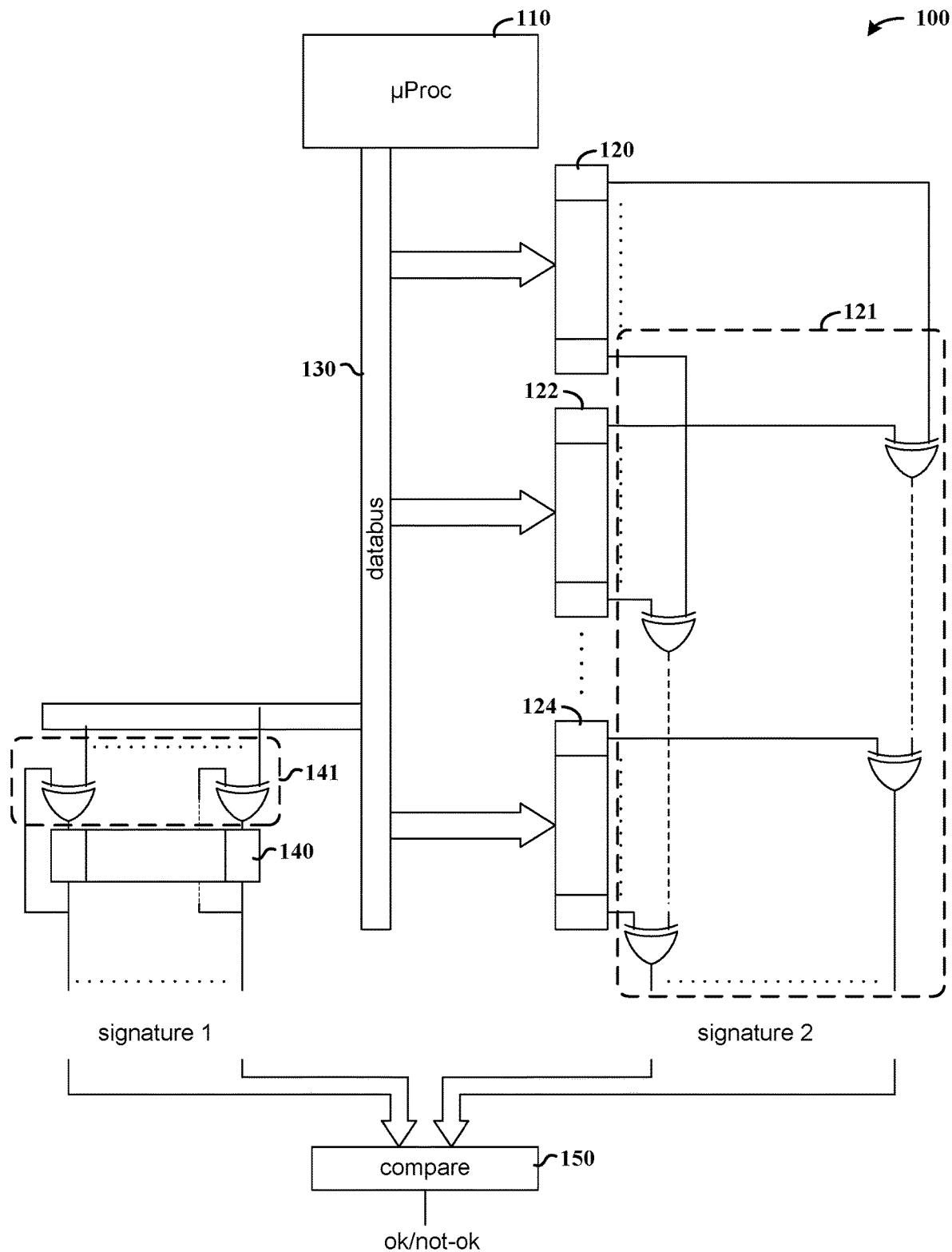
FIG. 1 shows an apparatus involving an approach to data assessment, in accordance with the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving data verification. In certain implementations, aspects of the present disclosure have been shown to be beneficial when used in the context of ensuring that data is written to a proper location and/or that data in respective locations is correct. In some embodiments, various aspects are directed to effecting comparisons between data stored in a particular storage location, and data intended to be stored at the particular storage location (e.g., to ensure data sampled from a bus and intended to be stored in a register, is actually stored properly in the register). Various such aspects, may, for example, be carried out in an ongoing manner and without necessarily requiring operation of a microprocessor generally used for controlling the storage and retrieval of the data. Implementations may include, for example, network-based systems used in the automotive industry where the integrity of data may be important for operation of systems such as automotive braking, lane keeping/departure, adaptive speed control, ethernet operations, and other advanced driver systems. While not necessarily so limited, various aspects may be appreciated through the following discussion of non-limiting examples which use exemplary contexts.

While various details are set forth to describe examples in the following discussion, it should be apparent to one skilled in the art that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Various aspects of the disclosure are directed to monitoring register updates (e.g., upon read), which can be effected for assessing whether data content is correct and/or whether addressing is correct. Implementations may be carried out without utilizing software or microcontroller resources used for data storage and retrieval, and therefore can be inserted in many applications without a significant penalty, supporting a fast response time and a short Fault Tolerant Time Interval (FTTI). Such monitoring can be ongoing, or continuous, and may be carried out independent of clocking initiated by the aforementioned microcontroller resources. This approach can lower the probability that a fault is not detected due to code execution errors, or errors, omissions or absence of fault detection code in a microprocessor system or its software. Further, monitoring for and detection of data and addressing faults can be carried out without the requirement for an initiator external to the safety hardware, lowering the probability that a fault is not detected because of inactivity of the microprocessor system, its components, or its software.

In accordance with one or more embodiments, a circuit-based apparatus includes a data bus, a plurality of configuration registers, and logic circuitry. The configuration registers receive configuration data over the data bus, and the logic circuitry ascertains whether data stored in each of the configuration registers accurately corresponds to the configuration data sent over the data bus for writing into each of the configuration registers. The logic circuitry generates and compares respective signatures for verifying the accuracy of data in the registers. For instance, the logic circuitry may store a first data signature corresponding to a logical derivation of the configuration data sent over the data bus, and logically combine outputs corresponding to data read out from each of the configuration registers into a second signature. The first and second data signatures can be processed and compared accordingly, and if desired, an output indicative of a data error can be presented. As such, the first data signature can be generated using data obtained from the data bus and intended to be stored in the configuration registers, and the second data signature can be generated using data actually stored in the registers. The comparison can thus indicate, for example, whether data in the registers is accurate, or whether data has been written into the wrong register. Moreover, data validation in this regard can be carried out without using resources of a microprocessor used to read and write the data.

The data signatures can be generated using one or more of a variety of approaches. In some embodiments, XOR operations are used to generate the signatures. As such, an XOR operation is carried out on data to be written to one of the configuration registers, with the content of a signature register, for generating a first signature based on data obtained from the bus. The result of the XOR operation may be stored as a first signature output in the signature register. The outputs corresponding to data read out from the plurality of configuration registers into the second data signature can be XOR-ed, and combined to provide the second signature. Accordingly, when the signature comparison results in a mismatch, a data storage failure is detected and an output indicative of the failure can be generated.

Data in registers can be updated as follows, with comparison suppressed during the update process to mitigate errors, in connection with one or more embodiments. An output value of the one of the configuration registers is temporarily set to a logic "0," outputs of the registers are XOR-ed, and a Boolean difference between the result of the XOR operation and a stored version of the second data signature is generated. The first data signature is generated by XOR-ing the Boolean difference and the updated configuration data received on the data bus. While the output value of the one of the plurality of configuration registers is set to the logic "0," comparison of the first and second data signatures is suspended.

Addressing errors can be handled as follows, in connection with one or more embodiments. Configuration data sent over the data bus is selectively rotated (e.g., by shifting each bit in the data by one position, based on parity of a register to which the data is intended to be used), and the logical derivation is carried out on the selectively rotated configuration data. The outputs corresponding to the registers are logically combined by first rotating certain ones of the outputs based on the same condition utilized for selectively rotating data for generating the first signature, with outputs of other ones of the registers being left as-is. Address location faults can then be detected based on the comparison of the first and second data signatures, where a mismatch occurs. This approach may involve, for example, detecting a single point fault in decoding of the address that leads to a different signature than expected when the data is written to a proper address, where the address differs from the actual address by one bit. For instance, when data is rotated but its intended address should not have been rotated, the rotated data provides an indication that the data was written to the wrong address. Similarly, when data is not rotated but its intended address was expected to be rotated (e.g., based on parity of the address), the lack of rotation provides an indication that the data was written to the wrong address.

Various embodiments such as those above may include a microprocessor circuit, including at least one microprocessor coupled to the data bus, which executes software for storing the data in the plurality of configuration registers. Logic circuitry as characterized herein processes and compares data signatures within hardware of the logic circuitry and separate from the microprocessor operation.

As may be implemented in connection with one or more apparatus or method-based embodiments, a first data signature is generated, which corresponds to a logical derivation of configuration data sent over a data bus. Outputs that correspond to data read out from each of a plurality of configuration registers, which receive the configuration data over the data bus, are logically combined into a second data signature. The first data signature and the second data signature are processed and compared for ascertaining that stored data, as stored in each of the plurality of configuration registers, accurately corresponds to the configuration data sent over the data bus for writing into each of the plurality of configuration registers. This approach may be useful, for example, for comparing data obtained from a data bus with data actually stored in registers to which the data on the bus is intended to be written, to ensure that data in the registers is accurate and/or is written to the proper register location. Processing the data for the first signature may involve, for example, performing an XOR operation on data to be written to one of the configuration registers with the content of a signature register, and storing the result of the XOR operation as a first signature output in the signature register. An XOR operation can be performed on the outputs for generating the second signature. The signatures can then be compared for ascertaining a mismatch (e.g., which can trigger an output indicative of a data storage failure).

Where a value in a register is to be updated, an output value of the register to be updated is set to a logic "0" and an XOR operation is performed on the outputs of the registers. A Boolean difference between the result of the XOR operation and a stored version of the second data signature is ascertained and used when generating the first data signature, by performing an XOR operation on the Boolean difference and the updated configuration data as received on the data bus. While the output value of the register being updated is set to the logic "0," processing and comparing of the first and second data signatures is suspended to avoid errors.

Data written to an improper address can be detected as follows. The first data signature is generated by rotating the configuration data obtained from the data bus based on parity of the intended address for the configuration data, and the logical derivation is performed on the rotated configuration data. Similarly, data output from certain ones of the plurality of configuration registers is also rotated based on the parity of the registers, while maintaining data output from ones of the plurality of configuration registers having an opposite parity. Faults in address location are detected based on the comparison of the first data signature and the second data signature, using the understanding that only data in certain registers is rotated.

Turning now to the figures, FIG. 1 shows an apparatus 100 involving an approach to data assessment, in accordance with the present disclosure. The apparatus 100 is shown with a microprocessor 110, registers 120, 122 and 124 (with additional or fewer registers contemplated), and a data bus 130 via which data is sent from the microprocessor to the registers. A signature register 140 is coupled to the data bus 130, also for receiving (e.g., sampling) the data that is sent from the microprocessor 110 to the registers 120, 122 and 124 over the data bus, and which is processed via circuitry 141 to generate a first signature. Circuitry 121 processes data output from the registers 120, 122 and 124 and generates a second signature therefrom. A comparator circuit 150 compares the first and second signatures, and generates an output based on the comparison. While the signatures are shown by way of example as being generated using XOR functions, the circuitry 121 and 141 may include additional and/or alternative circuitry, which generates respective signatures that can be compared for assessing validity.

Certain embodiments involve a subset of circuitry shown in FIG. 1. For instance, in some embodiments, an apparatus includes a first circuit 141 that generates the first data signature, corresponding to a logical derivation of configuration data sent over a data bus. A second circuit 121 logically combines outputs corresponding to data read out from each of the (e.g., configuration) registers 120, 122 and 124 into a second data signature. The comparator circuit 150 ascertains whether stored data, as stored in each of the registers 120, 122 and 124 accurately corresponds to the configuration data sent over the data bus 130 for writing into each of the plurality of configuration registers, by comparing the first data signature and the second data signature. Such circuitry 121, 141 and 150 may be utilized as an add-on to existing circuitry, such as may include the microprocessor 110, registers 120, 122 and 124, and data bus 130. Such an approach may, for example, involve operation of the circuitry 121, 141 and 150 in a manner that is generally separate from, or independent from, operation of the microprocessor 110. Using this approach, the microprocessor 110 is not burdened with data verification. Furthermore, such data verification can be carried out in an ongoing/continuous-type manner, facilitating real-time detection of errors. These aspects may be useful, for example, in safety-based applications such as the automotive applications characterized herein.

In certain embodiments, the first circuit 141 may thus generate the first data signature using data obtained from the data bus and intended to be stored in the configuration registers 120, 122 and 124. The comparator circuit 150 provides an output based on the comparing, where the output being indicative of whether the data obtained from the bus and intended to be stored in the configuration registers 120, 122 and 124 matches data actually stored in the configuration registers.

A specific implementation involving FIG. 1 is as follows. When a data word is written to one of the registers 120, 122 or 124, that data word is XOR-ed with the content of signature register 140 and the result is stored in that signature register. The outputs of the registers 120, 122 and 124 are XOR-ed, and the resulting data word is the second signature. The respective signatures may be implemented in a manner that is representative of the state of the design, with the first signature representing the state in a time-rolled-up form, and the second signature representing the state in a space-rolled-out form. The signatures are compared at the comparator circuit 150, an output is provided. Such an output may be generated only if there is a mismatch representing a data word storage failure, or may also be generated to indicate that the data is accurate (no mismatch).

Figure 2:
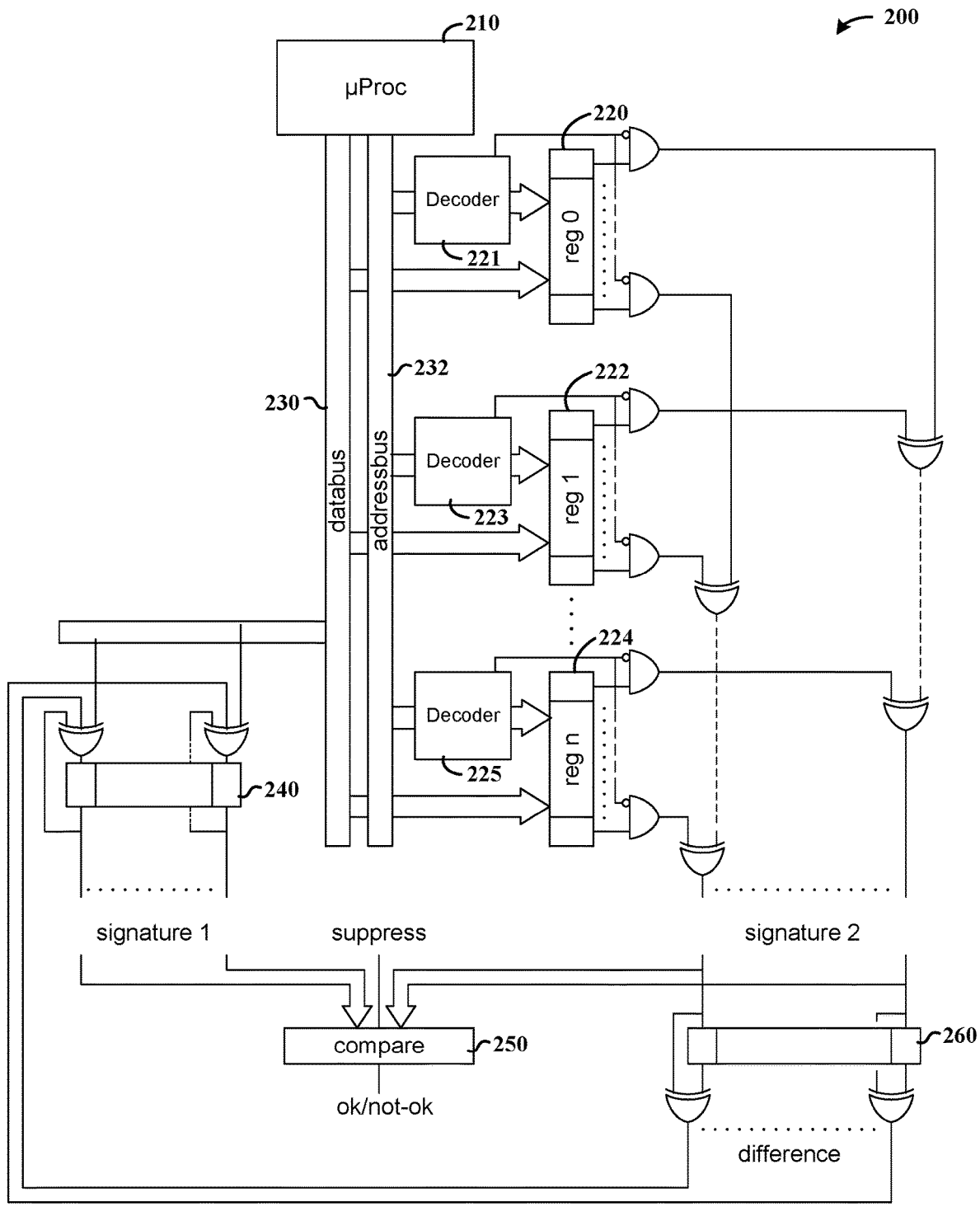
FIG. 2 shows an apparatus illustrating another example approach to data assessment, in accordance with the present disclosure.

FIG. 2 shows an apparatus 200 illustrating another example approach to data assessment, in accordance with the present disclosure. The apparatus 200 may be implemented in a manner similar to the apparatus 100 in FIG. 1, with similar numbering utilized in this regard. The apparatus 200 is shown with a microprocessor 210, registers 220, 222 and 224 (with additional or fewer registers contemplated), a data bus 230 via which data is sent from the microprocessor to the registers, and an address bus 232. Decoders 221, 223 and 225 respectively decode address information on the address bus 232, for storing data in the respective registers 220, 222 and 224.

A signature register 240 is coupled to the data bus 230, also for receiving the data that is sent from the microprocessor 210 to the registers 220, 222 and 224 over the data bus, and which is processed via circuitry (represented as XOR circuits) to generate a first signature. Data output from the registers 220, 222 and 224 is processed using data from the respective decoders 221, 223 and 225, with XOR circuitry and gates as shown by way of example to generate a second signature, which can be stored at register 260. A difference value corresponding to a current second signature generated from the outputs of the registers 220, 222 and 224 and a previously stored (second) signature at 260 is generated and provided for an XOR function with the data used to store the first signature at signature register 240. A comparator circuit 250 compares the first and second signatures, and generates an output based on the comparison.

The apparatus 200 can be implemented as follows, in accordance with one or more embodiments. When a value in one of the registers 220, 222 and 224 needs to be updated, the operation of the comparator circuit 250 is suppressed to ensure that the contribution of previously stored information is not improperly utilized. Accordingly, the output of the intended register to be written to is temporarily made 0 for determining signature 2. This leads to a Boolean difference with a stored copy of the signature 2, which is equal to the data present in the register that is going to be written into. This difference is XOR'ed with the input to the signature register 240 to account for the removal of the data in the register being written to. During the time that the output of the intended register is made 0, the comparator action is suppressed.

Figure 3:
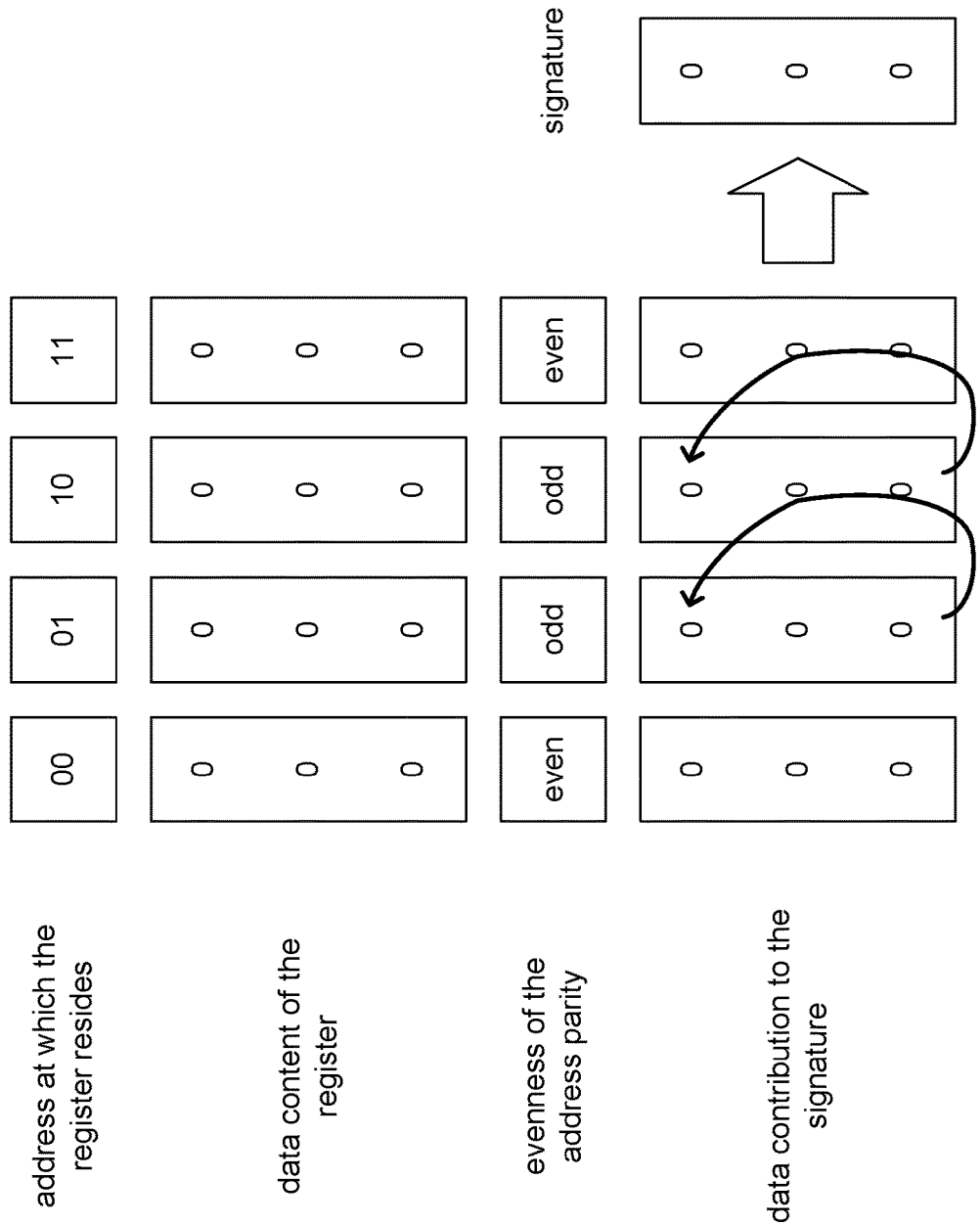
FIG. 3 shows data register addresses and related operations for data assessment, in accordance with the present disclosure.
Figure 4:
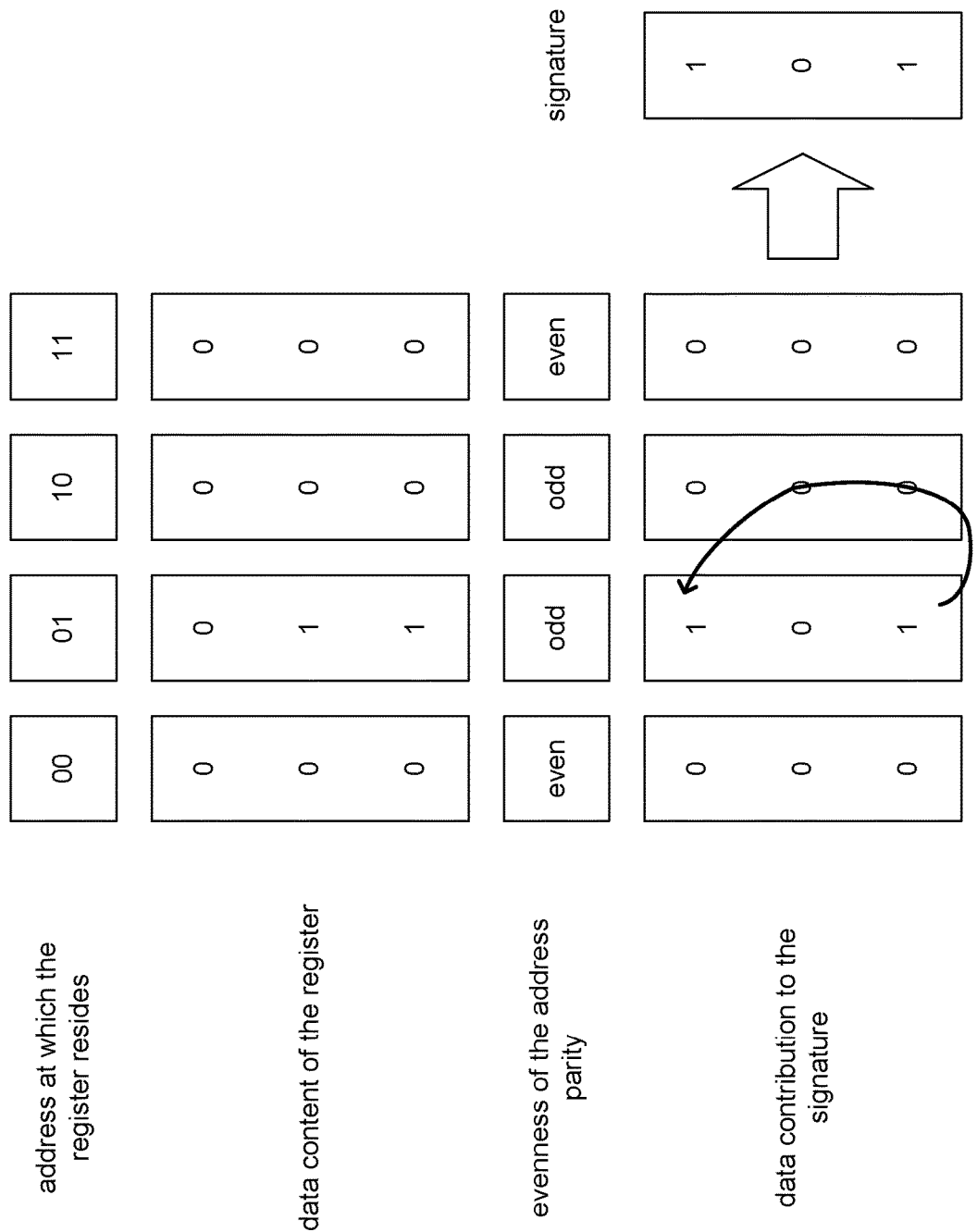
FIG. 4 shows data register addresses and other related operations for data assessment, in accordance with the present disclosure.
Figure 5:
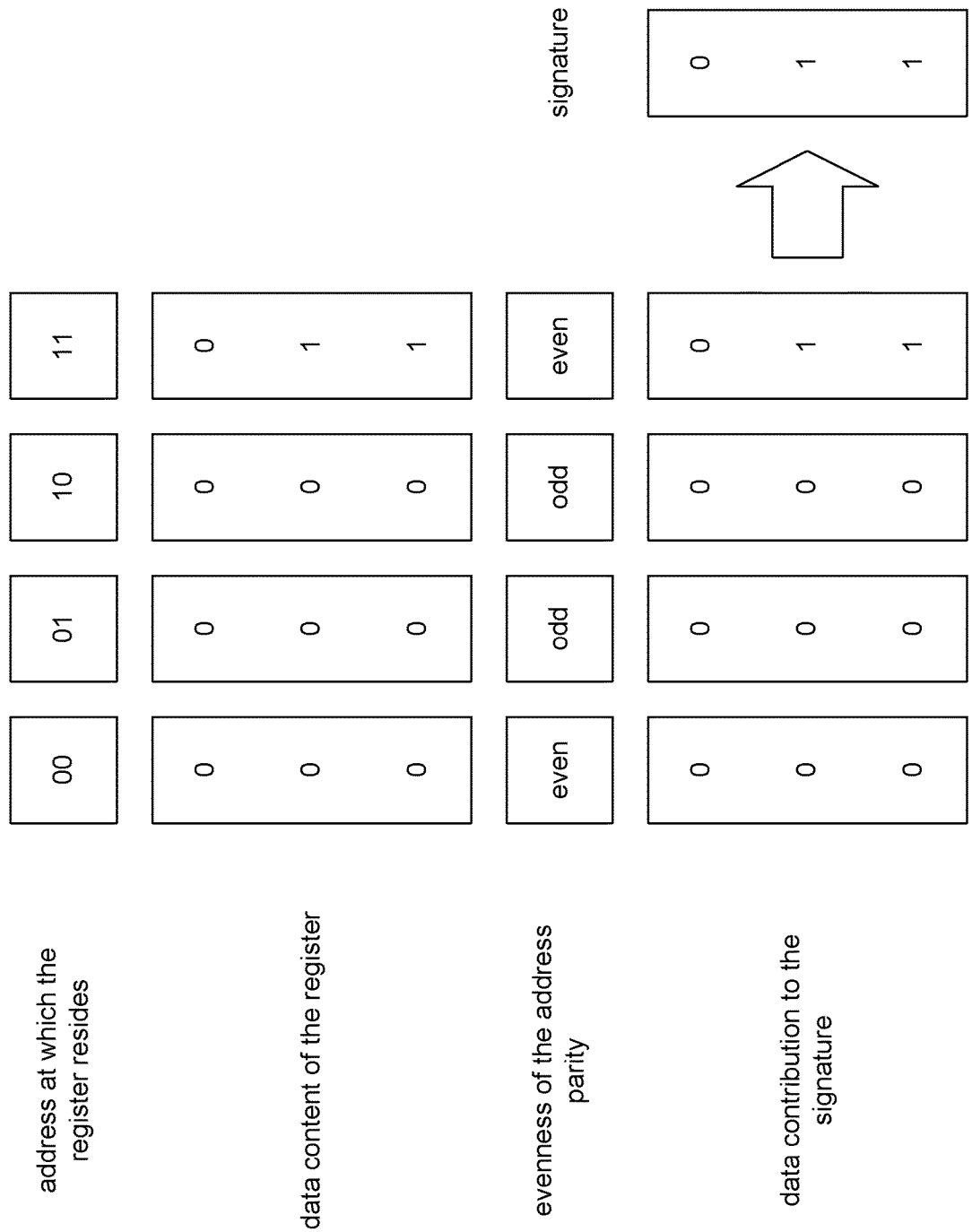
FIG. 5 shows data register addresses and other related operations for data assessment, in accordance with the present disclosure.

FIGS. 3-5 show data register addresses and related operations for data assessment, in accordance with the present disclosure. Beginning with FIG. 3, data content in the odd registers 01 and 10 is rotated, as shown by the arrows, with the bottom value rotated to the top position, and the top two positions shifted down. Data content in the even registers 00 and 11 is left as-is. The resulting signature reflects the rotated data. Here, with all data as "0" there is no net change. FIG. 4 shows a rotate operation for a data word "011" in the register 01, which has been written correctly. The address "01" has odd parity, so the contribution to the signature of the data written to that register is rotated as indicated by the arrow. The resulting signature now becomes "101." FIG. 5 shows a rotate operation for the situation where "011" is written to the register at address "01" incorrectly. If there is a single fault in the addressing and the data inadvertently ends up in the register with address location "11," the contribution to the signature of the data written to that register is kept as the address "11" has even parity. The resulting signature now becomes "011". This is different from the expected signature "101", and hence the addressing fault can be detected. For instance, when the signature is compared with a signature generated from data sent on a data bus and to be written into the registers, where the same rotation of the data contribution is carried out, the comparison will show a fault.

In certain embodiments, a rotation approach as characterized herein is implemented in the context of automotive communications, such as those involving safety circuitry, using an alternate rotate operation based on the address values. In the context of certain such embodiments involving automotive safety, the underlying cause of this error can be assumed to be a single fault. This can be for instance a short/open/stuck-at of one of the address bits in an address decoder of registers. This single fault can lead to an actual address differing from the intended address by only one bit, and consequently, will change the evenness of the parity of the address. In other words, an address with even parity will change in an address with odd parity and vice versa. If the contribution towards the signatures of the data in registers with addresses with even parity is kept as is, and the contribution towards the signatures of the data in registers with odd parity is rotated, then a single point fault in the address decoding will lead to a different signature than expected, and this fault can be detected.

Figure 6:
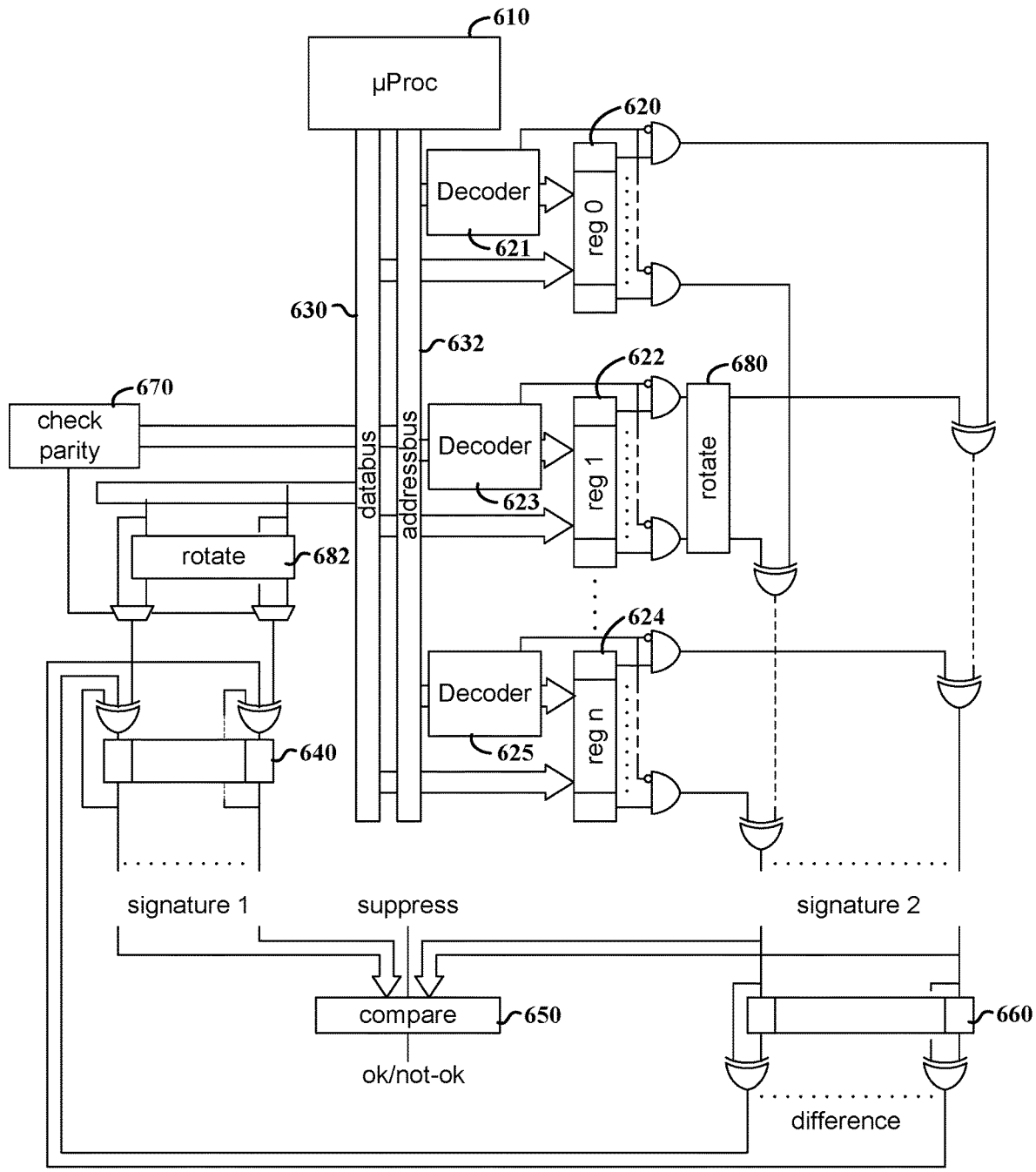
FIG. 6 shows an apparatus illustrating another example approach to data assessment and involving data rotation for verification, in accordance with the present disclosure.

FIG. 6 shows an apparatus 600 illustrating another example approach to data assessment and involving data rotation for verification, in accordance with the present disclosure. The apparatus 600 may, for example, be implemented to carry out a rotation approach as characterized above, such as in FIGS. 3-5, and may detect faults in address location as well as data content (e.g., as in FIGS. 1 and 2). The apparatus 600 includes circuitry similar to that characterized with FIGS. 1 and 2, includes similar numbering, and may be implemented to carry out embodiments in a similar manner as discussed therewith. A microprocessor 610 communicates data and address information to registers 620, 622 and 624 over a data bus 630 and an address bus 632. Decoders 621, 623 and 625 respectively decode address information on the address bus 632, for storing data in the respective registers 620, 622 and 624.

A signature register 640 is coupled to receive a signature generated from data on the data bus 630, with certain sets of the data being rotated at circuit 682 based on parity of a register in which the data is intended to be written to, as detected at circuitry 670. Data output from the respective registers 620, 622 and 624 is processed using data from the respective decoders 621, 623 and 625, with XOR circuitry and gates as shown by way of example, to generate a second signature. Data output from the register 622 is rotated at 680 based on its parity. The resulting signature is stored at register 660.

When a data update is to be carried out, similar to the approach shown in FIG. 2, a difference value corresponding to a current second signature generated from the outputs of the registers 620, 622 and 624 and a previously stored (second) signature at 660 is generated and provided for an XOR function with the data used to store the first signature at signature register 640. A comparator circuit 650 compares the first and second signatures, and generates an output based on the comparison. The function of the comparator 650 is suppressed during the update.

Various embodiments herein may be implemented in connection with Ethernet-type circuitry, such as a switch. Configuration and signature data can be kept in clocked registers, where the configuration registers are writable via a bus, such as an advanced peripheral bus (APB). The configuration registers reside in a module that is a bus slave to both an internal microcontroller and an access point, such as a serial peripheral interface (SPI), at chip level. At power-up and/or reset, an initial configuration is set, and a register containing a signature is given an appropriate initial value as well. After that, the content of a subset of configuration registers can be updated. The update can be effected via firmware tailored to an end-customer, where each different customer and/or customer application can utilized a different configuration register subset and different configuration data that can be updated either once or multiple times.

The update can also be effected via SPI access over an SPI access point, which is dependent on end-customer access.

Terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

The skilled artisan would recognize that various terminology as used in the specification (including claims) connote a plain meaning in the art unless otherwise indicated. As examples, the specification describes and/or illustrates aspects useful for implementing the claimed disclosure by way of various circuits or circuitry which may be illustrated as or using terms such as blocks, modules, device, system, unit, controller, microprocessor, register, decoder, comparator, and/or other circuit-type depictions (e.g., reference numerals 610, 620, 621, 640, 650, 660, 670 and 680 of FIG. 6 may depict a block/module as described herein). Such circuits or circuitry are used together with other elements to exemplify how certain embodiments may be carried out in the form or structures, steps, functions, operations, activities, etc. For example, in certain of the above-discussed embodiments, one or more modules are discrete logic circuits or programmable logic circuits configured and arranged for implementing these operations/activities, as may be carried out in the approaches shown in the figures. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process as described above (e.g., in connection with comparing signatures, assessing differences, checking parity, and rotating data) is used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit). As another example, where the Specification may make reference to a "first [type of structure]", a "second [type of structure]", etc., where the [type of structure] might be replaced with terms such as ["circuit", "circuitry" and others], the adjectives "first" and "second" are not used to connote any description of the structure or to provide any substantive meaning; rather, such adjectives are merely used for English-language antecedence to differentiate one such similarly-named structure from another similarly-named structure (e.g., "first circuit configured to convert . . . " is interpreted as "circuit configured to convert . . . ").

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. For instance, a multitude of disparate registers can be assessed as characterized herein, and comparisons may be effected in various manners. As another example, different approaches for assessing parity, or data-location review (e.g., every third, odd, even, or other register location grouping can be assessed via rotation) can be carried out in a manner generally consistent with embodiments herein. Such modifications do not depart from the true spirit and scope of various aspects of the disclosure, including aspects set forth in the claims.

What is claimed is:

1. A circuit-based apparatus comprising:
    a data bus;
    a plurality of configuration registers configured and arranged to receive and store configuration data over the data bus; and
    logic circuitry configured and arranged to ascertain that configuration data stored in each of the plurality of configuration registers accurately corresponds to the configuration data sent over the data bus for writing into each of the plurality of configuration registers, by:
        storing a first data signature, corresponding to a logical derivation of the configuration data sent over the data bus, and including storing the first data signature by performing an XOR operation on data to be written to one of the configuration registers with the content of a signature register, and storing the result of the XOR operation as a first signature output in the signature register;
        logically combining outputs, each output corresponding to data read out from each of the plurality of configuration registers, into a second data signature; and
        processing and comparing the first data signature and the second data signature.

2. The apparatus of claim 1, wherein the logic circuitry is configured and arranged to:
    generate the first data signature using data obtained from the data bus and intended to be stored in the configuration registers; and
    provide an output based on the processing and comparing, the output being indicative of whether the data obtained from the bus and intended to be stored in the configuration registers matches data actually stored in the configuration registers.

3. The apparatus of claim 1, wherein the logic circuitry is configured and arranged to carry out the processing and comparing of the first data signature and the second data signature without using a microprocessor that controls read and write operations involving the plurality of configuration registers.

4. The apparatus of claim 1, wherein the logic circuitry is configured and arranged to generate an output indicating a data storage failure in response to the comparing of the first data signature and the second data signature being indicative of a data error.

5. The apparatus of claim 1, wherein the logic circuitry is configured and arranged to:
    carry out the step of logically combining the outputs corresponding to data read out from the plurality of configuration registers into the second data signature by performing an XOR operation on the outputs; and
    in response to the step of processing and comparing the first data signature and the second data signature indicating a mismatch representing data storage failure, generating an output indicative of the failure.

6. An apparatus comprising:
    a data bus;
    a plurality of configuration registers configured and arranged to receive and store configuration data over the data bus; and logic circuitry configured and arranged to ascertain that configuration data stored in each of the plurality of configuration registers accurately corresponds to the configuration data sent over the data bus for writing into each of the plurality of configuration registers, by:
  storing a first data signature, corresponding to a logical derivation of the configuration data sent over the data bus;
  logically combining outputs, each output corresponding to data read out from each of the plurality of configuration registers, into a second data signature; and
processing and comparing the first data signature and the second data signature, wherein the logic circuitry is configured and arranged to, when updated data is to be written to one of the plurality of configuration registers:
set an output value of the one of the plurality of configuration registers to a logic "0";
performing an XOR operation on outputs of the plurality of configuration registers, and determining a Boolean difference between the result of the XOR operation and a stored version of the second data signature;
storing the first data signature for the one of the plurality of configuration registers by performing an XOR operation on the Boolean difference and the updated configuration data as received on the data bus for storing in the plurality of configuration registers; and
while the output value of the one of the plurality of configuration registers is set to the logic "0," suppressing the step of processing and comparing of the first data signature and the second data signature.

7. An apparatus comprising:
a data bus;
a plurality of configuration registers configured and arranged to receive and store configuration data over the data bus; and
logic circuitry configured and arranged to ascertain that configuration data stored in each of the plurality of configuration registers accurately corresponds to the configuration data sent over the data bus for writing into each of the plurality of configuration registers, by:
  storing a first data signature, corresponding to a logical derivation of the configuration data sent over the data bus;
  logically combining outputs, each output corresponding to data read out from each of the plurality of configuration registers, into a second data signature; and
processing and comparing the first data signature and the second data signature, wherein the logic circuitry is configured and arranged to detect that data is written to an improper location by:
generating the first data signature by rotating the configuration data sent over the data bus for writing into selected ones of the plurality of configuration registers and read from the data bus, and performing the logical derivation on the rotated configuration data; and
logically combining the outputs into the second data signature by rotating data output from ones of the plurality of configuration registers having a first parity while maintaining data output from ones of the plurality of configuration registers having a second parity, one of the first and second parities being an odd parity and the other one of the first and second parities being an even parity, and logically combining the outputs; and detecting a fault in the address location based on the comparison of the first data signature and the second data signature.

8. The apparatus of claim 7, wherein detecting the fault includes detecting a single point fault in decoding of the address that leads to a different signature than an expected when the data is written to a proper address, with the address differing from the actual address by one bit.

9. The apparatus of claim 7, wherein rotating the configuration data sent over the data bus, in the step of generating the first data signature, includes rotating or not rotating sets of the configuration data based upon the parity of the configuration register to which the set of configuration data is intended to be written.

10. The apparatus of claim 7, wherein detecting the fault includes detecting that the written data is rotated, based on an expectation that the data is written to an address where the output of the corresponding configuration register is not rotated, according to parities of the respective addresses.

11. The apparatus of claim 7, wherein detecting the fault includes detecting that the written data is not rotated, based on an expectation that the data is written to an address where the output of the corresponding configuration register is rotated, according to parities of the respective addresses.

12. The apparatus of claim 7, wherein the logic circuitry is configured and arranged for rotating the data by shifting each bit in the data by one position.

13. The apparatus of claim 1, further including a microprocessor circuit, including at least one microprocessor coupled to the data bus, configured and arranged to execute software and for storing the data in the plurality of configuration registers in response to the execution of the software, wherein the logic circuitry is configured and arranged to carry out the processing and comparing of the initial data signature within hardware of the logic circuitry and independent of the microprocessor.

14. A method comprising:
generating a first data signature, corresponding to a logical derivation of configuration data sent over a data bus;
logically combining outputs, each output corresponding to data read out from each of a plurality of configuration registers that receive and store the configuration data sent over the data bus, into a second data signature;
performing a logical XOR operation on data communicated with at least one of the plurality of configuration registers; and
ascertaining, in response to the logical XOR operation, that stored configuration data, as stored in each of the plurality of configuration registers, accurately corresponds to the configuration data sent over the data bus for writing into each of the plurality of configuration registers, by processing and comparing the first data signature and the second data signature.

15. The method of claim 14,
wherein generating the first data signature includes using data obtained from the data bus and intended to be stored in the configuration registers; and
further including providing an output based on the processing and comparing, the output being indicative of whether the data obtained from the bus and intended to be stored in the configuration registers matches data actually stored in the configuration registers.

16. The method of claim 15,
wherein generating the first data signature includes performing an XOR operation on data to be written to one of the configuration registers with the content of a signature register, and storing the result of the XOR operation as a first signature output in the signature register;

wherein logically combining the outputs includes performing an XOR operation on the outputs; and further including, in response to the step of ascertaining indicating a mismatch between the result of the XOR operations, generating an output indicative of a data storage failure.

17. The method of claim 14, further including, in response to updated data being written to one of the plurality of configuration registers:

setting an output value of the one of the plurality of configuration registers to a logic "0";

performing an XOR operation on outputs of the plurality of configuration registers, and determining a Boolean difference between the result of the XOR operation and a stored version of the second data signature;

storing the first data signature for the one of the plurality of configuration registers by performing an XOR operation on the Boolean difference and the updated configuration data as received on the data bus for storing in the plurality of configuration registers; and while the output value of the one of the plurality of configuration registers is set to the logic "0," suppressing the step of processing and comparing of the first data signature and the second data signature.

18. The method of claim 14, wherein generating the first data signature includes rotating the configuration data sent over the data bus for writing into selected ones of the plurality of configuration registers and read from the data bus, and performing the logical derivation on the rotated configuration data; and wherein logically combining the outputs includes rotating data output from ones of the plurality of configuration registers having a first parity while maintaining data output from ones of the plurality of configuration registers having a second parity, one of the first and second parities being an odd parity and the other one of the first and second parities being an even parity, and logically combining the outputs; and further including detecting a fault in the address location based on the comparison of the first data signature and the second data signature.

* * * * *